United States Patent [19]
OBrien et al.

[11] Patent Number: 6,040,590
[45] Date of Patent: Mar. 21, 2000

[54] SEMICONDUCTOR DEVICE WITH ELECTROSTATIC CONTROL

[75] Inventors: John OBrien, Pasadena; Axel Scherer, Laguna Beach; Amnon Yariv, San Marino; Reginald Lee, Pasadena; Yuanjian Xu, Pasadena; Oskar Painter, Pasadena, all of Calif.

[73] Assignee: California Institute of Technology, Kanagawa-ken, Japan

[21] Appl. No.: 08/990,145

[22] Filed: Dec. 12, 1997

Related U.S. Application Data

[60] Provisional application No. 60/032,660, Dec. 12, 1996.

[51] Int. Cl.[7] .................................................. H01L 33/00
[52] U.S. Cl. ........................... 257/94; 257/95; 257/96; 257/97; 257/99; 372/45; 372/46; 372/48
[58] Field of Search ............................. 257/94, 95, 96, 257/97, 99; 372/45, 46, 48

[56] References Cited

U.S. PATENT DOCUMENTS

| | | | |
|---|---|---|---|
| 3,702,975 | 11/1972 | Miller | 331/94.5 H |
| 4,408,330 | 10/1983 | An | 372/45 |
| 4,534,033 | 8/1985 | Nishizawa et al. | 372/50 |
| 5,063,569 | 11/1991 | Xie | 372/45 |
| 5,241,554 | 8/1993 | Iga et al. | 372/46 |
| 5,341,391 | 8/1994 | Ishimura | 372/46 |
| 5,371,757 | 12/1994 | Largent | 372/50 |
| 5,543,638 | 8/1996 | Nettelbladt et al. | 257/98 |
| 5,764,670 | 6/1998 | Ouchi | 372/45 |

Primary Examiner—William Mintel
Attorney, Agent, or Firm—Fish & Richardson P.C.

[57] ABSTRACT

A semiconductor light-emitting device having one or more depletion regions that are controlled by one or more control electrodes to vary the spatial distribution of the carriers in an active layer. The voltages on the control electrodes can be controlled to modulate the current density in the active layer and the output light intensity. The polarization of a surface emitting diode laser based on this device can be controlled or modulated.

26 Claims, 10 Drawing Sheets

SEMICONDUCTOR DEVICE WITH ELECTROSTATIC CONTROL

This application claims the benefit of U.S. Provisional Application No. 60/032,660 filed on Dec. 12, 1996, which is incorporated herein by reference.

ORIGIN OF THE INVENTION

The U.S. Government has certain rights to this invention pursuant to Grant No. N00014-96-1-1295 awarded by the Advanced Research Projects Agency.

FIELD OF THE INVENTION

The present invention relates to semiconductor optoelectronic devices, and more specifically, to light-emitting semiconductor devices.

BACKGROUND OF THE INVENTION

Many semiconductor light-emitting devices produce light through radiative recombination of electrons and holes at a p-n junction. Both bulk materials and quantum well structures may be used to form p-n junctions. Quantum well p-n heterojunctions can produce high light-emitting efficiency in this type of light-emitting devices. In operation, a driving electrical current is applied to the p-n junction to inject carriers (i.e., electrons and holes) with energy above their respective equilibrium level into the p-n junction. A large portion of the electrons and holes recombine to release the excessive energy as light. The remaining electrons and holes recombine through nonradiative processes to produce heat. From another point of view, a majority of the electrons that are excited from the valence band to the conduction band by absorbing the energy from the driving current radiate photons by decaying back to the valence band.

Examples of such light-emitting devices include light-emitting diodes ("LEDs") and diode lasers. LEDs operate based on the spontaneous emission of photons, and diode lasers operate based on the stimulated emission of photons and population inversion. The structure of a diode laser is usually more complex than that of a LED since an optical cavity is required in a diode laser to provide necessary optical feedback for laser oscillations.

It is desirable to generate as much light as possible for a given amount of driving current in both LEDs and diode lasers. This aspect of a LED or diode laser can be characterized by electrical-to-light conversion efficiency, which is defined as the ratio of the output light power to the injected electrical power. In practical devices, increasing the electrical-to-light conversion efficiency can also reduce the heat caused by the remaining electrical energy from the injected driving current that is not converted into light. Low thermal dissipation is particularly desirable in manufacturing compactly integrated photonic circuits.

The electrical-to-light conversion efficiency of a LED or diode laser has an upper limit defined by the internal quantum efficiency of a p-n junction, which is the rate of emission of photons divided by the rate of supply of electrons (or holes). Choice of semiconductor materials, dopants and respective doping concentrations may be used to increase the quantum efficiency. Use of quantum well structures rather than bulk materials to form a p-n heterojunction, for example, is one approach to improve the quantum efficiency.

The device structure of a LED or diode laser may also affect the electrical-to-light efficiency. For a given p-n junction, the electrical-to-light efficiency is mainly determined by the device structure since the quantum efficiency is essentially fixed. Various structures for LEDs and diode lasers have been developed to improve the electrical-to-light efficiency. One effort in this area is to confine the driving current to a small spatial region at or near the active p-n junction in order to increase the current density in the p-n junction. This results in an increase in the rate of supply of electrons (or holes) to the p-n junction, and thereby increases the rate of photon emission.

In diode lasers, the electrical-to-light efficiency can be represented by a laser threshold current at which a population inversion is created between the conduction and valence bands. At this threshold current, the optical gain caused by the driving current is equal to the total optical loss. A low threshold current indicates a high electrical-to-light conversion efficiency. For a given active p-n junction with a fixed thickness and material compositions, the laser threshold current density is also given. Thus, confining current spatial distribution to a smaller region near or at the p-n junction increases the corresponding current density and effectively reduces laser threshold current.

SUMMARY OF THE INVENTION

The present disclosure provides electrically adjustable carrier confinement in semiconductor light-emitting devices (e.g., LEDs or diode lasers) based on electrostatic control of carriers. Such semiconductor light-emitting devices have at least one depletion-producing element to produce a depletion region to confine spatial distribution of the carriers within an active semiconductor medium. This electrostatic control can be used to change the current density and to implement a control mechanism.

One embodiment of the invention uses a reverse biased Schottky contact to produce the depletion region.

Another embodiment of the invention uses a MOS capacitor to produce the depletion region.

Yet another embodiment uses a reverse biased p-n junction to produce the depletion region.

The electrostatic control can be configured to be independent of the optical confinement in an index-guided diode laser. Under such a configuration, the laser operation may be controlled by separately configuring the carrier confinement and the optical confinement.

The depletion region may be adjusted to modulate certain properties of the output light such as output optical power in a semiconductor light-emitting device, laser polarization and threshold current of a diode laser.

These and other aspects and advantages of the invention will become more apparent in light of the following detailed description, including the accompanying drawings and appended claims.

DETAILED DESCRIPTION OF THE INVENTION

The present invention uses an adjustable electrostatic field within a LED or a diode laser to confine spatial distribution of the carriers and to implement a control mechanism. The carrier confinement can be configured to be independent of the optical confinement in an index-guided diode laser so that the laser operation may be controlled by separately configuring the carrier confinement and the optical confinement. In addition, the electrostatic field may be adjusted to modulate certain properties of the output light and to vary the laser threshold current of a diode laser.

Figure 1:
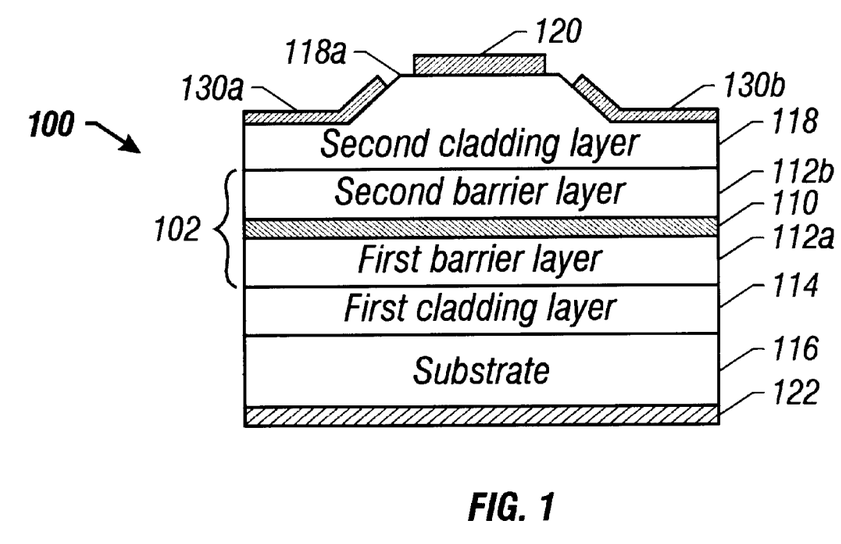
FIG. 1 is a diagram illustrating an edge-emitting device with Schottky contacts.

FIG. 1 is a cross-sectional diagram showing one embodiment of an edge-emitting LED or diode laser according to the invention. An active semiconductor layer 110 is sandwiched between first and second barrier layers 112a and 112b to form an active light-emitting medium 102. At least one of the first and second barrier layers 112a and 112b is made of a semiconductor material with a bandgap larger than that of the center active layer 110. Preferably, both barrier layers 112a and 112b have bandgaps larger than that of the center layer 110 to form a double heterojunction. The thickness of the center layer 110 may be reduced to a small value and the barrier layers 112a and 112b may be configured to form a single-crystal lattice with the center layer 110 so that the active medium 102 is a quantum well double heterojunction. The active medium 102 may also have two or more quantum well double heterojunction structures stacked together to form a multiple quantum structure.

Two cladding layers 114 and 118 having bandgaps larger than the center layer 110 are respectively formed on the sides of the active medium 102 to provide optical confinement in a direction perpendicular to the semiconductor layers since the indices of refraction of the cladding layers 114 and 118 are smaller than the center layer 110. The active medium 102 and the cladding layers 114 and 118 are formed on a substrate 116 so that the device 100 is monolithically integrated.

A ridge-like or mesa-like strip 118a may be formed on top of the second cladding layer 118 to effect an optical confinement due to the index variation in the direction parallel to the semiconductor layers. Ohmic contacts 120 and 122 are respectively formed on the semiconductor mesa 118a and the substrate 116 to inject carriers into the active layer 110 as electrical excitation and to provide a forward bias in the p-n junction in the active medium 102. This can be done by, for example, connecting the ohmic contacts 120 and 122 to an electrical current source. The ohmic contact 120 can be a strip due to the mesa-like strip 118a and limits the current distribution along the semiconductor layers. Therefore, the mesa-like strip 118a effects both optical confinement and carrier confinement.

Preferably, the semiconductor layers on one side of the active layer 110 may be doped to exhibit a conducting type (e.g., p-type) different from the semiconductor layers located on the other side (e.g., n-type). Therefore, if the first barrier layer 112a, the first cladding layer 114, and the substrate 116 are n-doped, the second barrier 112b, the second cladding layer 118 and the mesa 118a are then p-doped. Accordingly, the electrical potential of the ohmic contact 120 should be higher than that of the ohmic contact 122 so that a current is injected to flow from the ohmic contact 120 to the ohmic contact 122.

The embodiment 100 further implements two metallic control electrodes 130a and 130b that are directly formed over the second cladding layer 118 and the sides of the mesa strip 118a. Alternatively, the control electrodes 130a and 130b may also be located either on the sides of the mesa strip 118a only or on the surfaces of the second cladding layer 118 only. The control electrodes 130a and 130b may be symmetrically located with respect to the ohmic contact 120 and are insulated from the ohmic contact 120. The interface of the control electrodes 130a or 130b with the second cladding layer 118 and the mesa strip 118a effects a Schottky contact. Thus, a depletion region can be created within the second cladding layer 118 and the mesa strip 118a by applying a control voltage to apply a reverse bias the Schottky contact. The reverse biased Schottky contacts are nonconducting and each produce an electrostatic field gradient in the respective depletion region to repulse to the carriers. Since such a Schottky contact is formed on both sides of the mesa strip 118a, the carriers are confined within a reduced volume in the central region between the depletion regions. For a given driving current, the current density in the active medium 102 is effectively increased.

Therefore, the control electrodes 130a and 130b can be used to control the spatial distribution of the carriers and thereby change the current density within the active medium 102 without changing the driving current. When the device 100 is configured to operate as a LED, the control voltage applied to the control electrodes 130a and 130b may be varied to modulate the output light intensity.

The device 100 can be configured to operate as an edge-emitting laser by forming an optical cavity with the cavity optic axis along the direction of the mesa strip 118a. The control electrodes 130a and 130b can be used to change the laser threshold current by varying the spatial confinement of the carriers. For example, as the bias across the Schottky contact increases within a certain range, the depletion region produced by each control electrode increases, resulting in a reduced spatial profile of the driving current. This causes the laser threshold current to decrease since the current density in the active medium 102 is increased. Hence, the device 100 may be used to achieve a reduced laser threshold. Also, the control electrodes 130a and 130b may be used to provide a laser switch to turn on or off the laser oscillation by varying the current density above and below the laser threshold.

Furthermore, the control electrodes 130a and 130b may be used to modulate the output power of a laser based on the device 100. The driving current provided by the ohmic contacts 120 and 122 is maintained at a level so that the current density in the active medium 102 is above the laser threshold for a predetermined control voltage on the control electrodes 130*a* and 130*b*. Under this condition, the laser is activated and produces a fixed laser power. When the control voltage is changed within a range to alter the current density within the active medium 102 above the laser threshold, the output of the laser is also changed. Therefore, a modulation on the control voltage to the control electrodes 130*a* and 130*b* produces a modulation in the output laser power. Such a current modulation has simpler circuitry than many current modulation circuits that control the driving current since only the voltage is modulated. In addition, the response speed can be very fast since the RC time constant of the control electrodes can be made relatively small.

The Schottky contacts formed by the control electrodes 130*a* and 130*b* with the cladding layer 118 and the mesa strip 118*a* are reverse biased in order to achieve the above carrier confinement and operation control. This desired condition requires that the control voltage on each control electrode (130*a* and 130*b*) be at a value so that the electrical potential of each control electrode is higher than that of the ohmic contact 120 if the second cladding layer 118 and the second barrier layer 112*b* are p-doped and the electrical potential of each control electrode is lower than that of the ohmic contact 120 if the second cladding layer 118 and the second barrier layer 112*b* are n-doped. For example, when the first barrier 112*a*, the second cladding layer 114 and the substrate 116 are n-doped and the semiconductor layers on the other side of the active layer 110 are p-doped, the ohmic contact 120 can be at a positive voltage and the ohmic contact 122 can be grounded to provide a forward bias to the active layer 110. In this configuration, the potential on either of the control electrodes 130*a* and 130*b* should be higher than the positive voltage on the ohmic contact 120.

The device 100 of FIG. 1 effectively forms a field effect transistor ("FET") where the ohmic contracts 120 and 122 function as the source or drain terminals and the control electrodes 130*a* and 130*b* function as the gate for the FET. Since the gate is reverse biased, the gate does not change the magnitude of the driving current but rather controls the dimension of the conduction channel for the driving current.

The above electrostatic control can also be implemented in vertical-cavity surface emitting lasers ("VCSELs") and surface emitting LEDs. FIGS. 2A–2E and FIG. 3 show several embodiments in accordance with this aspect of the invention.

Figure 2A:
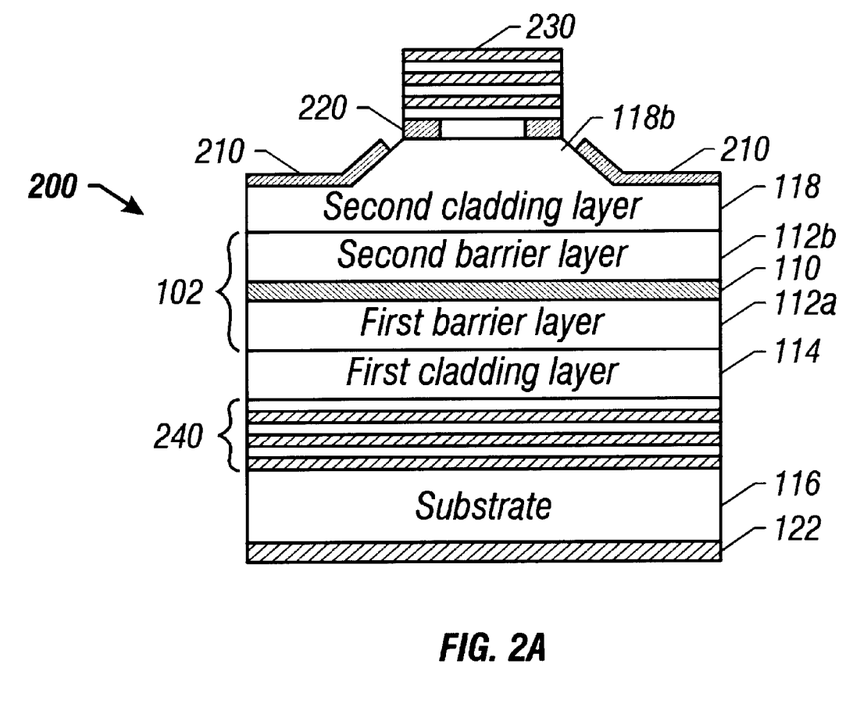
FIGS. 2A, 2B, 2C, 2D and 2E are cross sectional views of various embodiments of a vertical cavity surface emitting laser with an electrostatic control.

FIG. 2A shows a VCSEL 200 having a mesa formation 118*b* on top of the second cladding layer 118 and a control electrode 210. Similar to the control electrodes 130*a* and 130*b* in the device 100 of FIG. 1, the control electrode 210 forms a reverse-biased Schottky contact with cladding layer 118 and the mesa 118*b* to provide electrostatic control of the carrier distribution. An ohmic contact 210 on top of the mesa 118*b* may be transparent or may have an aperture (e.g., a central aperture) to allow for transmission of light. An optical cavity is formed by two optical reflectors 230 and 240 to have a cavity optic axis perpendicular to the semiconductor layers. The reflector 230 is formed on top of the ohmic contact 220 and can be made of any suitable optical reflective element. A reflector having multiple dielectric layers (e.g., a distributed Bragg reflector) may be used as the reflector 230. The other reflector 240 may be a stack of alternating quarter-wavelength semiconductor layers (also a distributed Bragg reflector) of different indices at a selected laser wavelength and can be formed between the first cladding layer 114 and the substrate 116. Alternatively, the indices of the layers in the reflector 240 may be chosen to be smaller than that of the active layer 110 so that the reflector 240 may also provide optical confinement and the first cladding layer 114 may be eliminated. As previously, the active medium 102 may be a quantum well structure.

Figure 2B:
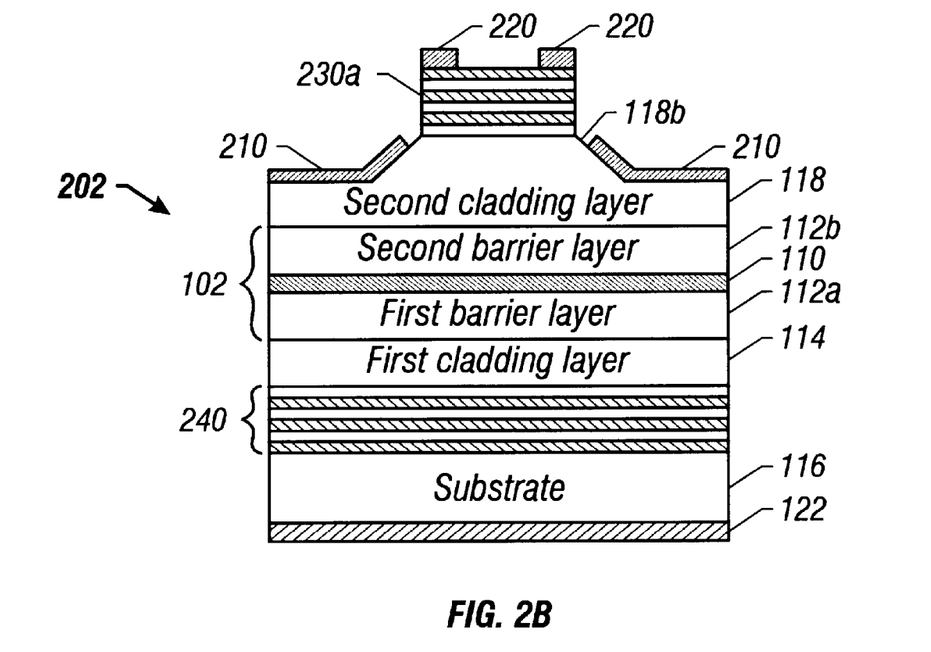

FIG. 2B shows a VCSEL 202 in which a reflector 230*a* is formed between the ohmic contact 220 and the mesa 118*b*. The reflector 230*a* may be a distributed Bragg reflector made of a stack of alternating quarter-wavelength semiconductor layers of different indices.

Figure 2C:
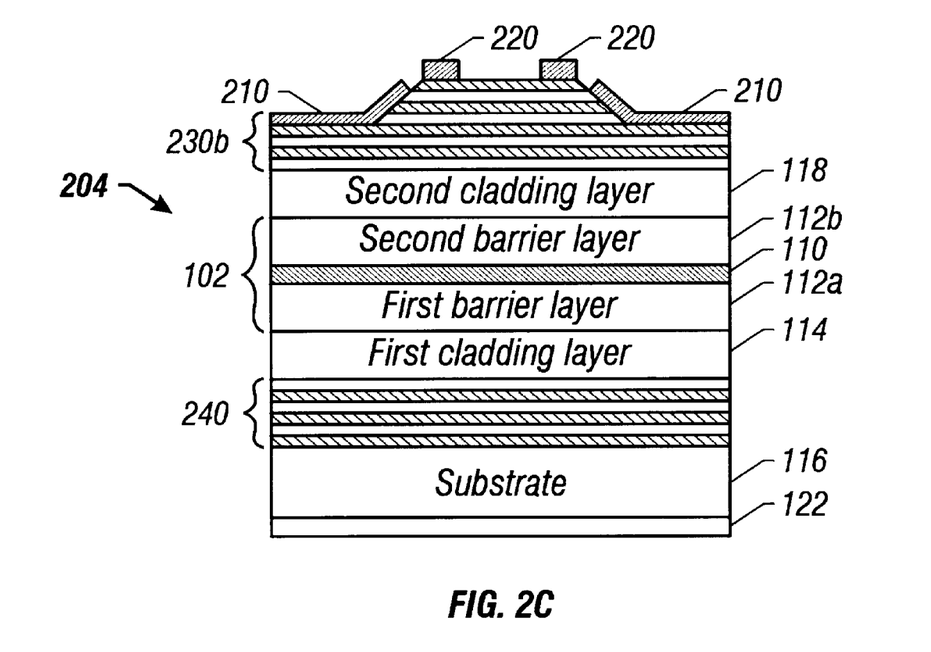

FIG. 2C shows a VCSEL 204 in which a reflector 230*b* is used to construct a mesa formation to accommodate the control electrode 210. The reflector 230*b* may be a distributed Bragg reflector having alternating quarter-wavelength semiconductor layers of different indices. The second cladding layer 118 may be eliminated if the indices of the quarter-wavelength semiconductor layers are higher than that of the active layer 110.

Figure 2D:
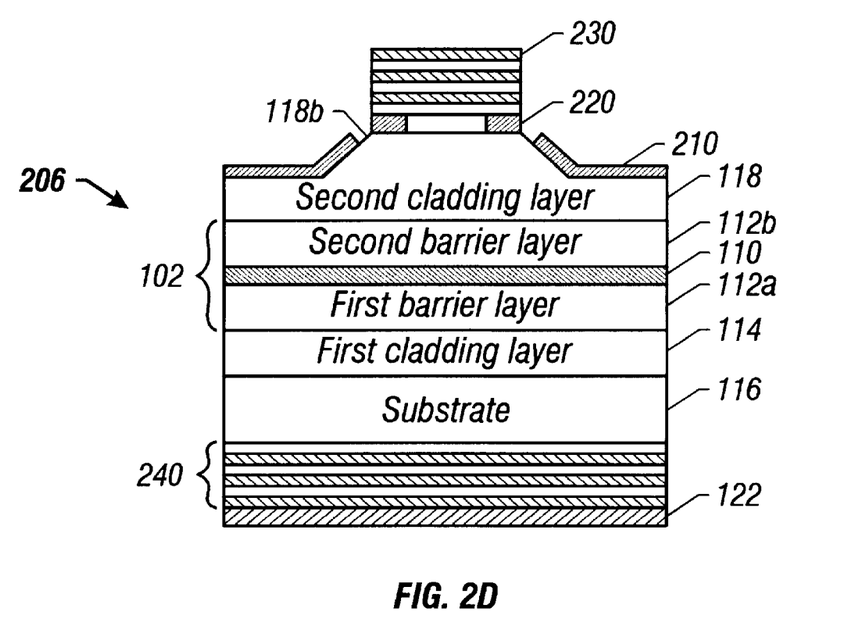
Figure 2E:
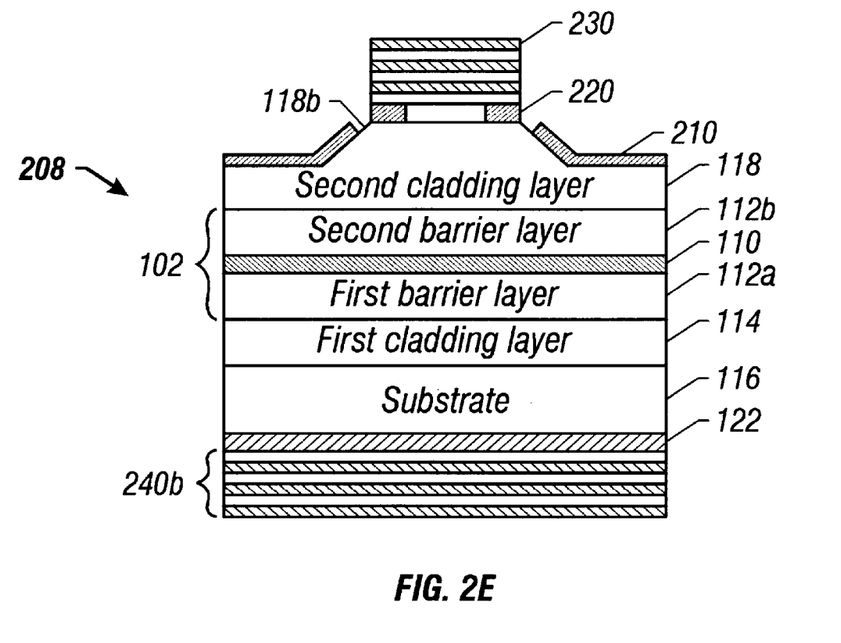

FIGS. 2D and 2E show other configurations of VCSELs with a control electrode 210. In FIG. 2E, the reflector 240*b* may be made of any suitable optical reflective element. However formed, a VCSEL has an optical cavity enclosing the active layer 110 with the cavity optic axis perpendicular to the semiconductor layers.

Figure 3:
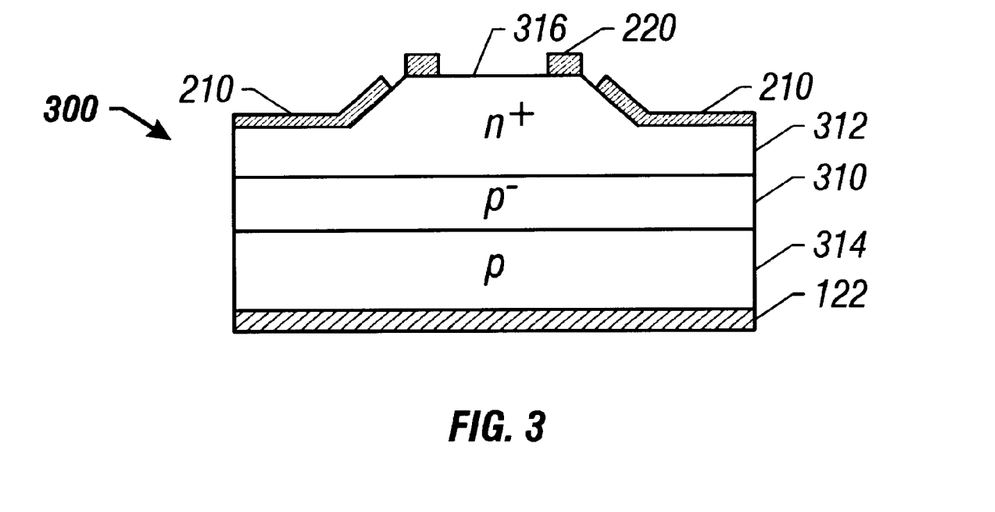
FIG. 3 is a diagram showing one embodiment of a surface-emitting LED.

FIG. 3 shows a surface-emitting LED 300 based on the above electrostatic control. A lightly p-doped semiconductor layer 310 and a n-doped semiconductor layer 312 forms a light-emitting p-n junction over a p-substrate 314. The n-doped layer 312 has a mesa 316 to accommodate the control electrode 210. The control voltage on the control electrode 210 can be varied to change the current density and thereby the output light intensity. An optical reflector may be optionally formed on the p-doped side of the p-n junction and redirect light emitted therein to n-doped layer 312 to increase the output intensity. For example, a Bragg reflector may be formed between the layers 310 and 314.

Figure 4:
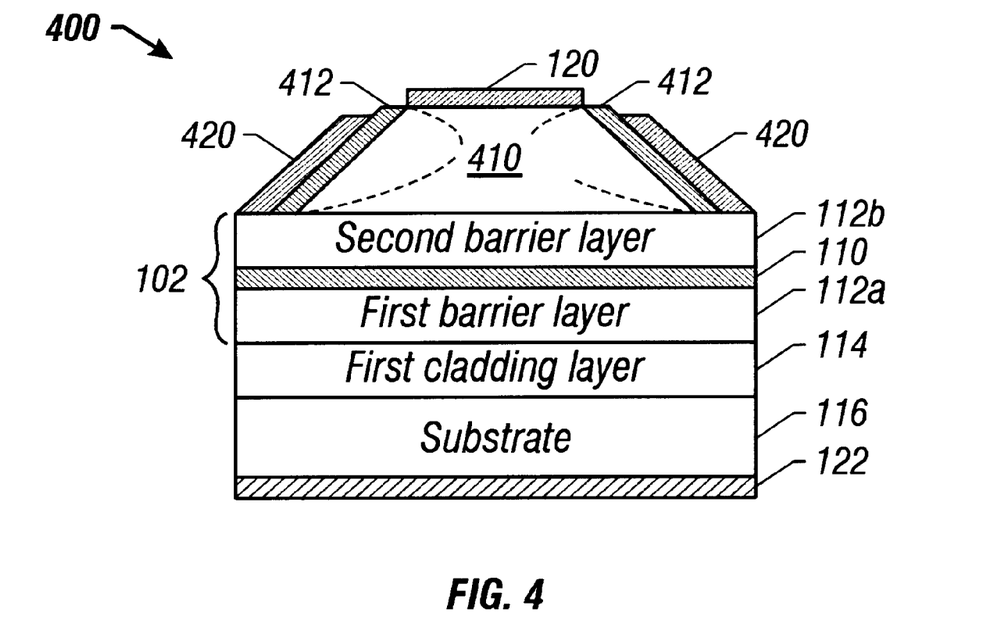
FIG. 4 is a diagram showing an edge-emitting device with a MOS capacitor structure for electrostatic control.
Figure 5:
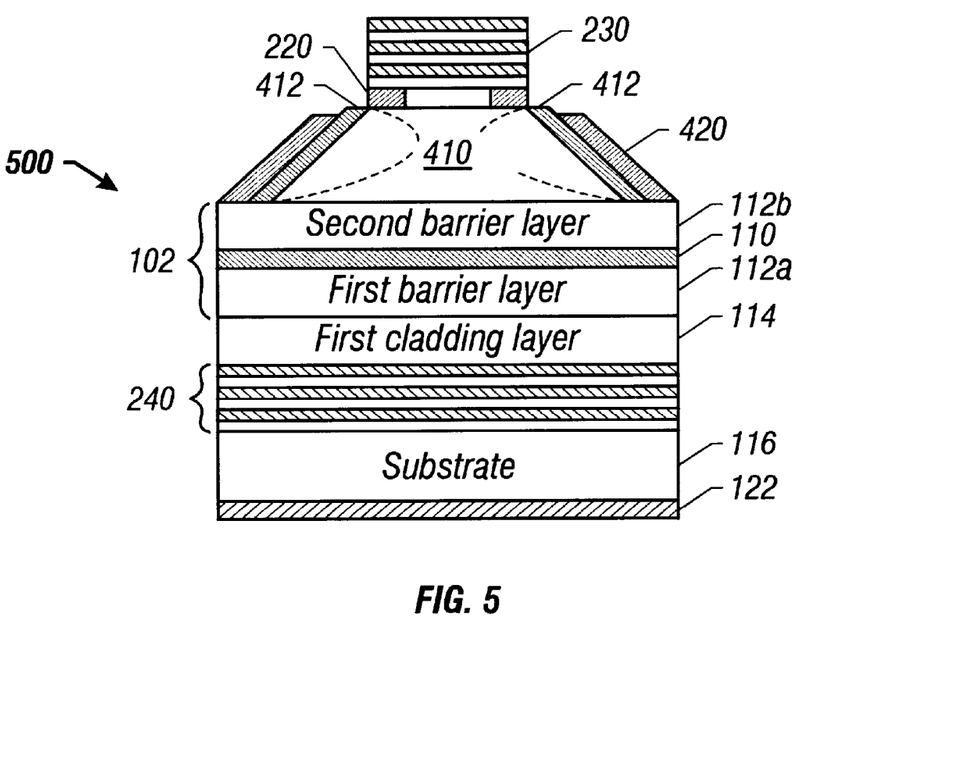
FIG. 5 is a diagram showing a vertical cavity surface emitting laser with a MOS capacitor structure for electrostatic control.

The electrostatic control produced by a reverse biased Schottky contact may also be produced by a metal-oxide-semiconductor ("MOS") capacitor formed in a light-emitting device (e.g., a LED or diode laser). FIGS. 4 and 5 respectively show an edge-emitting device 400 and a VCSEL 500 that implement an electrostatic control with a MOS capacitor.

Referring to FIG. 4, a semiconductor cladding layer 410 is formed to provide an electrostatic control in the edge-emitting device 400. The cladding layer 410 is a mesa-like strip and is made of a semiconductor materials with an index of refraction smaller than that of the active layer 110 of the active medium 102. Two ohmic contacts 120 and 122 are formed to inject a driving current to excite the active medium 102.

An oxidation layer 412 is formed on each side of the mesa strip 410 by, for example, using a known oxidation process or directly depositing an oxide layer. A control electrode 420 is then formed on each side of the mesa strip 410 over the respective oxidation layer 412 and is electrically insulated from the ohmic contact 120. Each control electrode 420 is applied with a control potential that causes a reverse bias across the control electrodes 420 and the second cladding layer 410. Hence, when the second cladding layer 410 is p-doped, the control potential is higher than the electrical potential of the ohmic contact 120; the control potential is lower than the electrical potential of the ohmic contact 120 when the second cladding layer 410 is n-doped. This configuration creates a nonconducting depletion region within the mesa strip cladding layer 410 near the oxidation layer 412. The depletion regions near both sides of the mesa strip cladding layer 410 confine the carriers in the central region. The size of the depletion regions can be varied by changing the control potential. Similar to the Schottky scheme, this provides a control over the current density and can be used to modulate the output light power and to change the threshold current in a laser.

FIG. 5 shows a VCSEL 500 using the MOS capacitor control. Other VCSEL configurations, including those shown in FIGS. 2B–2E, are also possible.

The devices shown in FIGS. 4 and 5 also effect a metal-oxide field effect transistor ("MOSFET") where the ohmic contracts 120 and 122 function as the source or drain terminals and the control electrodes 420 function as the gate for the MOSFET. Since the gate is reverse biased, the gate does not change the magnitude of the driving current but rather controls the dimension of the conduction channel for the driving current.

Figure 6:
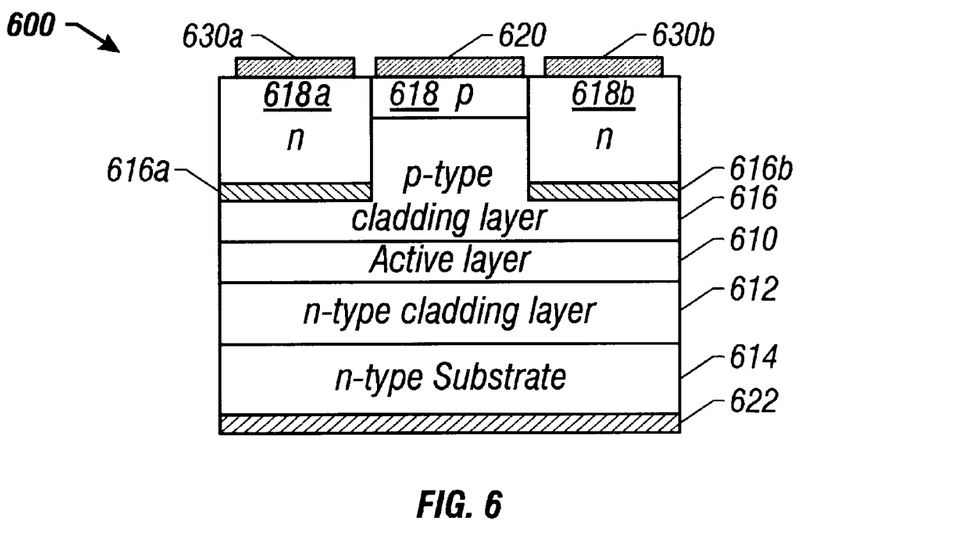
FIG. 6 is a diagram showing an edge-emitting device with a reverse biased structure for electrostatic control.

It is further contemplated that a reverse biased p-n junction may also be used to provide an electrostatic control. FIG. 6 shows an edge-emitting semiconductor device 600 according to this aspect of the invention. An active layer 610 and two cladding layers 612 and 616 are formed on a substrate 614. The cladding layer 616 may be doped to have a different conducting type (i.e., n- or p- doped) than that of the cladding layer 612 and the substrate 614 (i.e., p- or n-doped). FIG. 6 shows an example that the cladding layer 616 is p-doped for simplicity of description. A heavily p-doped layer 618 is formed over the cladding layer 616 for forming an ohmic contact 620.

The cladding layer 616 is processed to form a ridge structure sandwiched between two n-doped regions 618a and 618b. Two p-n junctions are formed on both sides of the ridge structure of the cladding layer 616 with the n-doped regions 618a and 618b, respectively. Two control electrodes 630a and 630b respectively formed on the n-doped regions 618a and 618b are electrically insulated from the ohmic contact 620 and provide a proper reversed bias to the respective p-n junction. Insulating regions 616a and 616b (e.g., oxidation layers) may be formed to prevent electrical breakdown.

The electrical potential applied to either 630a or 630b is higher than that of the ohmic contact 620 to implement the reversed bias in each p-n junction. This produces a non-conducting depletion region within the cladding layer 616 near each p-n junction and confines the carriers to flow through the central region between the depletion regions. The dimension of the depletion regions can be varied by the control potential to change the spatial distribution of the carriers and the current density. Similar to Schottky contact scheme and MOS capacitor scheme, a control of laser threshold current and a modulation of the output light power can be achieved.

Figure 7:
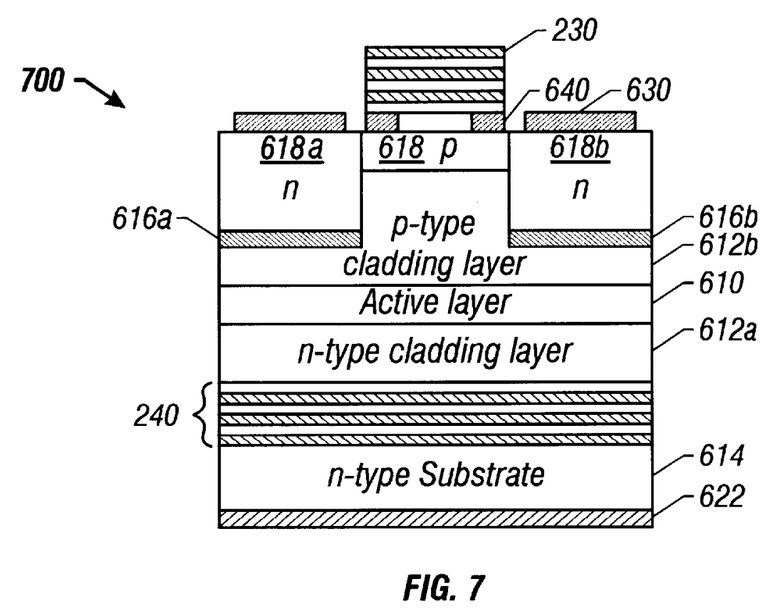
FIG. 7 is a diagram showing a vertical cavity surface emitting laser with a reverse biased structure for electrostatic control.

FIG. 7 shows a VCSEL 700 using the reverse biased p-n junctions to implement the electrostatic control. Other VCSEL configurations are also possible.

In the above-described VCSELs with electrostatic control based on the Schottky contact scheme, MOS capacitor scheme or the p-n junction scheme, the depletion region or regions are preferably symmetric with respect to the optic axis of the optical cavity formed by the two reflectors. In particular, two or more symmetrically located depletion regions may be used to modulate or control the output polarization of the laser oscillation.

Figure 8:
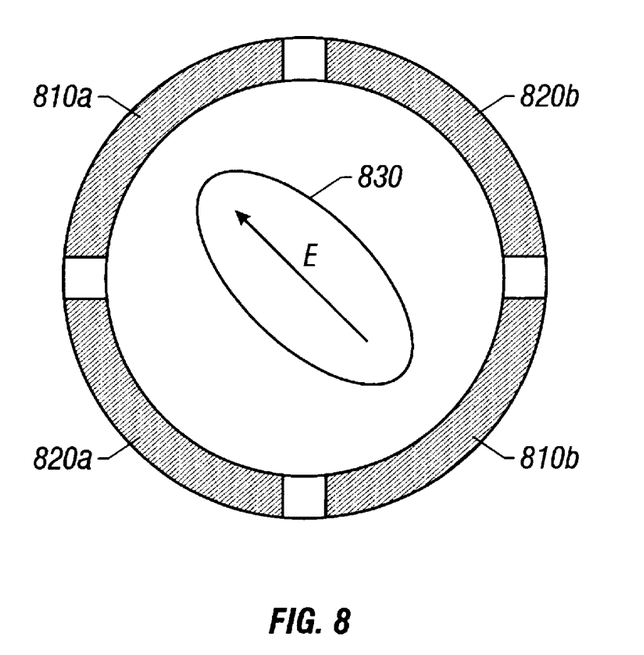
FIG. 8 is diagram showing a circular configuration of symmetrically arranged multiple control electrodes in a vertical cavity surface emitting laser for polarization control.

FIG. 8 shows one exemplary arrangement of multiple control electrodes for polarization control in accordance with this aspect of the invention. Four control electrodes 810a, 810b, 820a, and 820b are symmetrically disposed to form a circular arrangement. Any two adjacent control electrodes are separated and electrically insulated from each other. Each control electrode corresponds to a depletion region produced by a Schottky contact, a MOS capacitor, or a p-n junction formed thereunder. Any pattern arrangement other than the illustrated circular pattern may be used. The geometry of the control electrodes and the underlying Schottky contacts, MOS capacitors or p-n junctions may also be any suitable shape and dimension.

In operation, the electrical potentials applied to the multiple control electrodes may be adjusted to achieve a desired carrier distribution pattern. When the cross sectional shape of the carrier distribution is elongated in a selected direction, the optical gain for polarizations along that selected direction will be increased and the gain for polarizations orthogonal to that selected direction will be decreased. This produces an output laser beam with modes polarized along that selected direction.

In the example shown in FIG. 8, the opposing control electrodes 810a and 810b may be applied with voltages less than the voltages applied to the other two opposing control electrodes 820a and 820b to produce an elliptical carrier distribution 830. This carrier distribution produces an output laser beam polarized along the major axis of the ellipse as shown by the arrow "E".

Therefore, by controlling the spatial carrier distribution, the gain for an electric field polarized along a given direction can be controlled, without changing the total number of carriers. This technique can be used to stabilize the polarization of VCSELs which would be otherwise unstable and oscillate randomly. In addition, by applying proper varying control voltages to the control electrodes, the carrier distribution can be modulated to produce a modulation on the output polarization. Further, an amplitude modulation can be accomplished by passing the polarization-modulated output light from this type of VCSELs through a polarizer.

High-speed modulations can be achieved using this scheme since the RC time constant of the control electrodes and photon lifetime in the cavity can be made very short. Frequency chirp in such modulation can be significantly reduced since the total carrier density is constant.

The electrostatic control described above can also be used to control the transverse mode profile of the output beam in both edge-emitting configuration and the VCSEL configuration by changing the carrier distribution. For example, the output beam profile can be controlled for coupling the beam into an optical fiber.

Figure 9A:
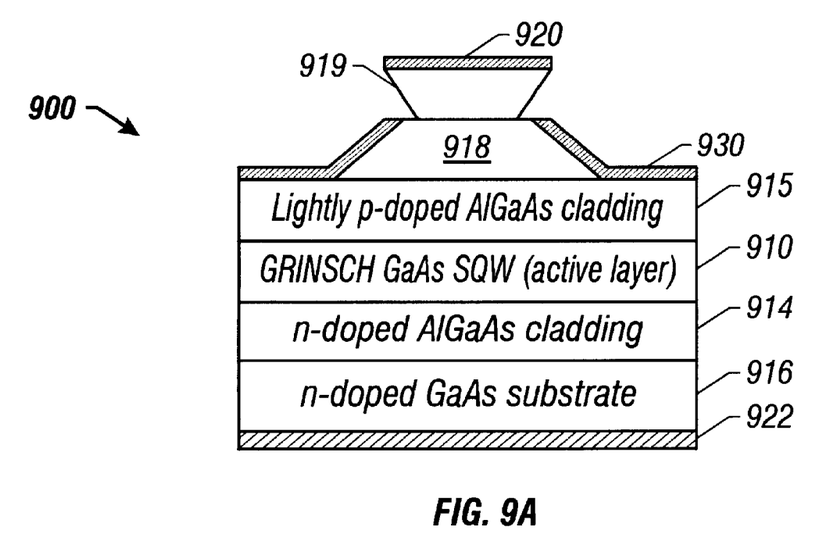
FIG. 9A shows one implementation of the edge-emitting device structure shown in FIG. 1.

FIG. 9A shows a cross sectional view of one implementation of the electrostatic control based on the Schottky contact scheme. The device 900 is an edge-emitting diode laser. The structure is grown on a n-doped silicon GaAs substrate 916 by using molecular beam epitaxy. An active layer 910 has a single 10-nm GaAs quantum well within a graded index separate confinement heterostructure ("GRINSCH") with barriers graded between $Al_{0.5}Ga_{0.5}As$ and $Al_{0.2}Ga_{0.8}As$. The active layer 910 is sandwiched between two adjacent cladding layers 914 and 915 which are respectively n-doped and p-doped AlGaAs layers of about 2 $\mu m$ in thickness. Doping in the n-type cladding layer 914 is about $3\times10^{18}$ cm$^{-3}$ (Si). The p-AlGaAs layer 915 is lightly doped with Be at about $3\times10^{15}$ cm$^{-3}$ to provide a low doped region for the Schottky contact. A graded p-Al0.5Ga$_{0.5}$As cladding layer 918 of about 0.33 $\mu m$ is formed on top of the cladding layer 915 and the doping level of Be is linearly increased to about 3×10¹⁸ cm⁻³. A graded p-GaAs contact layer 919 of about 0.33 μm is further formed over the cladding layer 918 with Be doping graded from about 3×10¹⁸ cm⁻³ to about 1×10¹⁹ cm⁻³ in order to provide good ohmic contact. A first ohmic p-contact 920 made of Cr/Au is formed on the contact layer 919 and a second ohmic n-contact 922 made of AuGe/Au is formed on the substrate 916. Electrodes 930 (Cr/Au) form the Schottky contacts with the cladding layers 918 and 915.

The layers 918 and 919 are configured to form a ridge waveguide by using a chemically assisted ion beam etch ("CAIBE") with Cl₂/Ar⁺. This anisotropic etching is performed at approximately 35 degrees from the surface normal from either side of a photoresist strip mask until the lightly p-doped layer 915 was exposed. The undercutting of the photoresist mask allows for the self-aligned deposition of Cr/Au electrodes 920 and 930. Alternatively, the ridge waveguide may also be formed by performing an anisotropic wet etch with a suitable etchant solution (e.g., a 1:8:40 solution of H₂SO₄:H₂O₂:H₂O) to provide the necessary undercut. Argon ion milling is used with a photoresist mask to electrically isolate the device. Finally, the wafer is lapped down to approximately 6 mils and an AuGe/Ni/Au layer was applied on the substrate 916 to form the ohmic contact 922.

Figure 9B:
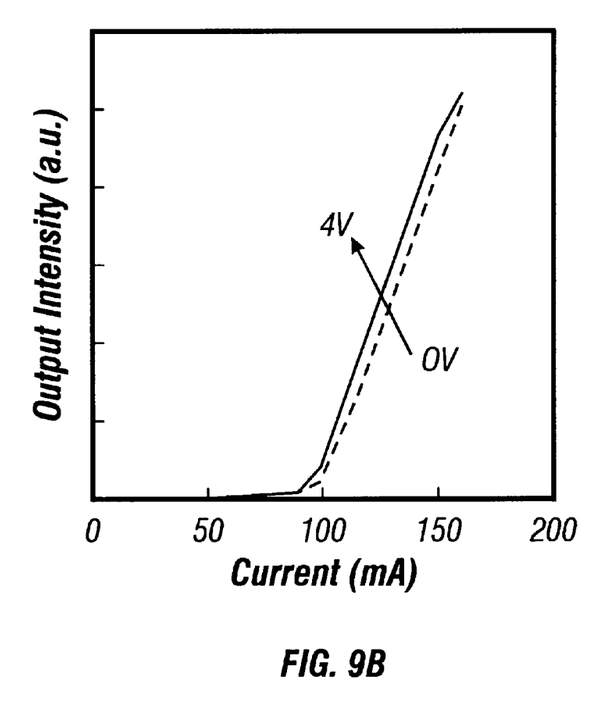
FIGS. 9B, 9C, 9D and 9E are charts showing measured data obtained from lasers using the implementation of FIG. 9A.

FIG. 9B is a chart showing the measured output power as a function of the driving current for a 13-μm wide laser. Only one control electrode was applied with a control voltage. The laser was pumped with current pulses of 250 ns at 30 kHz. A 4%~5% reduction in laser threshold current was observed when a control voltage of about 4 V was applied on one of the control electrodes. The depletion range change due to this 4-V voltage was estimated to be about 0.5 μm to about 0.6 μm. When the control voltage is applied the both of the control electrodes, the effect can be expected to approximately double. The performance of the electrostatic control can be further improved by improving the laser structure.

Figure 9C:
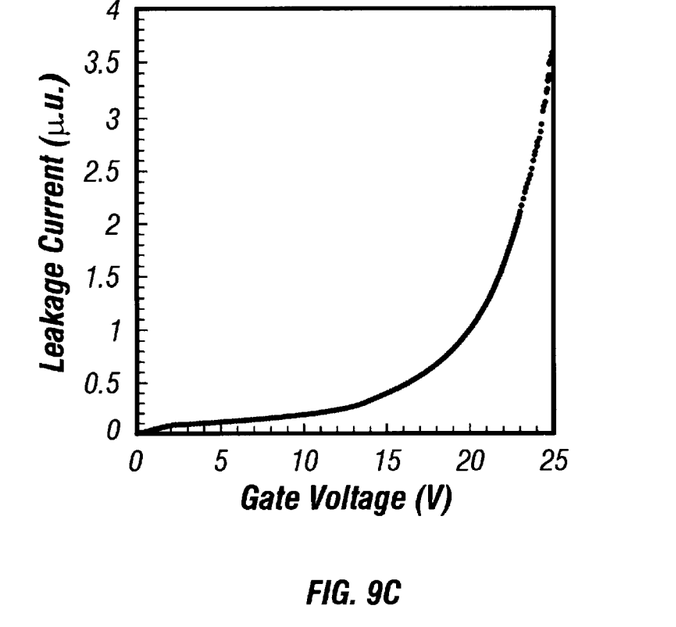

The leakage current through the reverse biased Schottky contact was also measured with a laser of 25 μm wide and 500 μm long. This is shown in FIG. 9C. The measured current leakage corresponds to a leakage current density of less than 32 mA/cm². Broad area laser threshold density for this material is about 260 A/cm². The data indicates that the leakage current through the Schottky contact produced by the control electrode is negligibly small compared to the pump current and could not account for the increase in the output power.

Figure 9D:
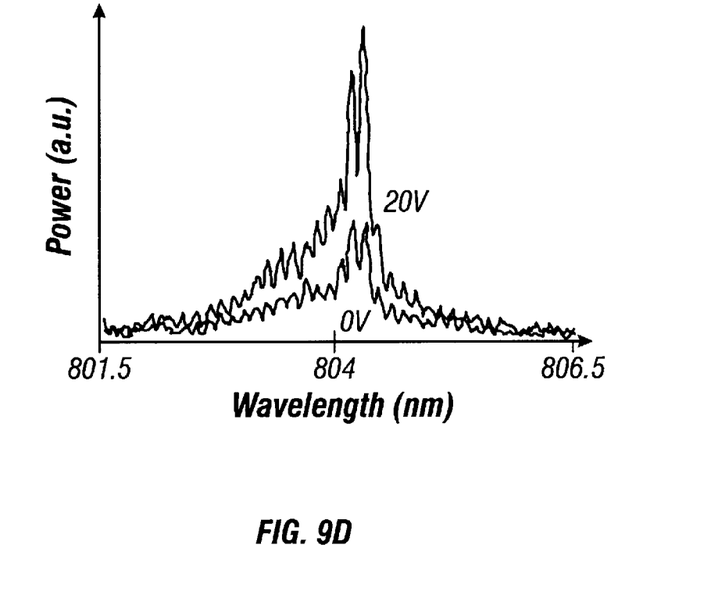

FIG. 9D shows the measured laser output spectrum for a control voltage scanning from 0 V to about 20 V. A laser of about 60 μm wide and 600 μm long was used in the measurements. The pump current was controlled at a constant slightly above the threshold. The laser operated in a multimode configuration. A significant increase in the output power was measured as the control voltage increased without measurable wavelength shift. More specifically, the peak output power at the control voltage of 20 V is more than double the peak power when the control voltage is at zero. This indicates that the effect of the electrostatic control with the depletion region on the round trip cavity phase shift is small enough not to significantly affect the lasing spectrum under the resolution of the measurement system. The data further indicates that the depletion region mainly affects the carrier distribution within the laser cavity.

Figure 9E:
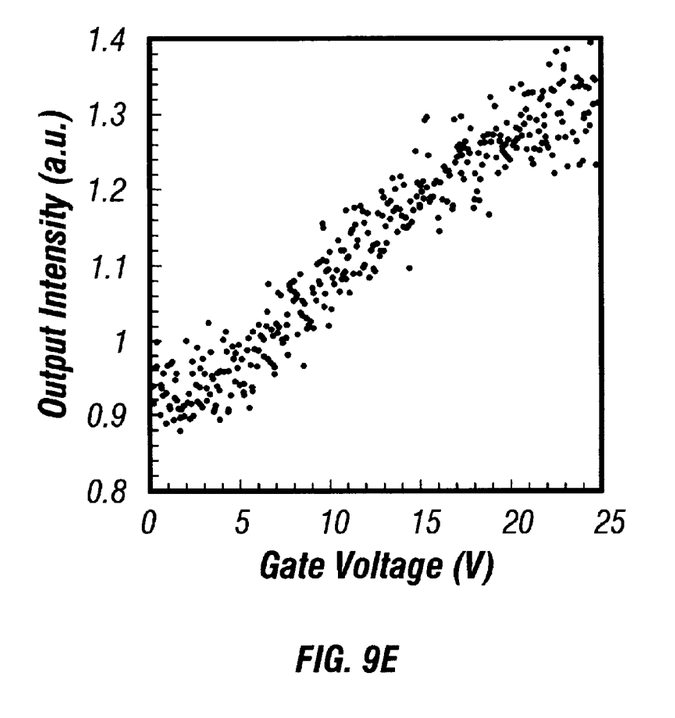

FIG. 9E further shows the variation in the integrated power with the control voltage on the Schottky contacts. The measurements were taken from the same laser under the same operating conditions as for the measurements shown in FIG. 9D. The optical power increases by a factor of approximately 1.5 for an increase from 0 v to 25 V in the control voltage applied only to one control electrode.

Figure 10A:
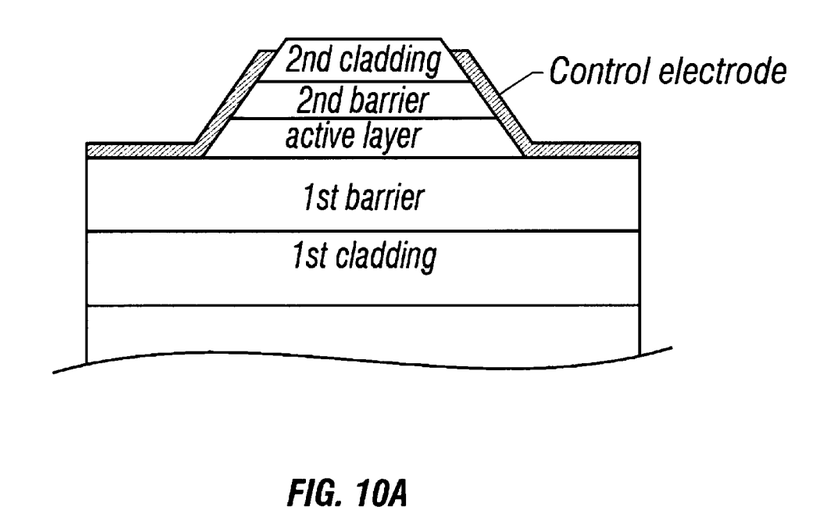
FIGS. 10A and 10B are diagrams showing alternative embodiments in which an active layer is located adjacent to control electrodes.
Figure 10B:
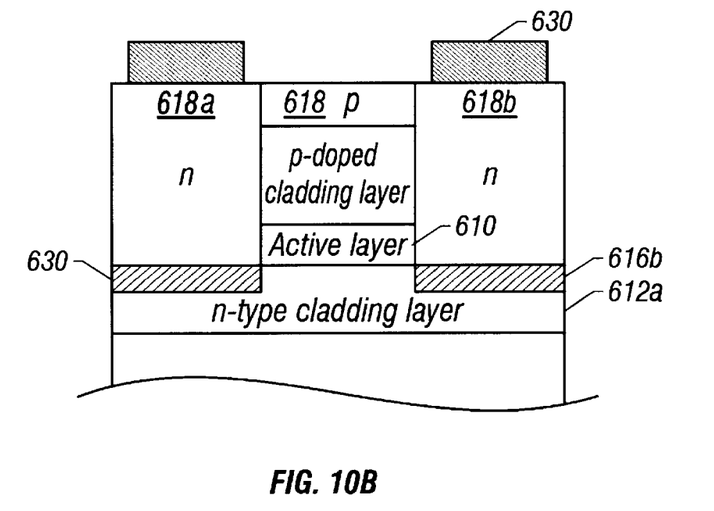

Although the present invention has been described in detail with reference to a few embodiments, one ordinarily skilled in the art to which this invention pertains will appreciate that various modifications and enhancements may be made without departing from the scope and spirit of the invention. For example, the active layer may be formed closer to control electrodes in order to more effectively confine the carrier distribution within the active layer. FIGS. 10A and 10B illustrate this configuration in the Schottky contact scheme (FIG. 10A) and the reverse biased p-n junction scheme (FIG. 10B).

Figure 11:
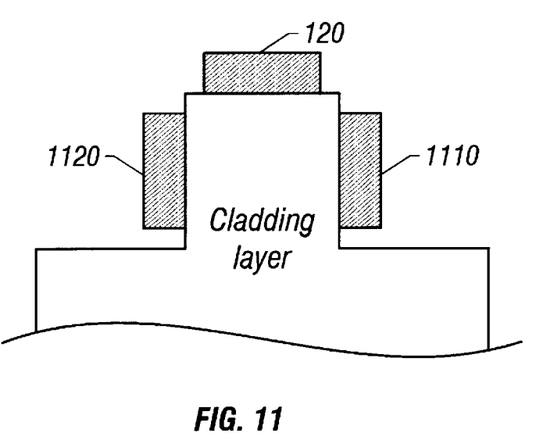
FIG. 11 is a diagram showing an example of a different mesa geometry.

The geometry of the mesa cladding layers may be made different from the slanted shapes as described. For example, FIG. 11 illustrates another geometry of the mesa cladding layer. Two control electrodes 1110 and 1120 are respectively formed on the sides of the mesa.

Figure 12:
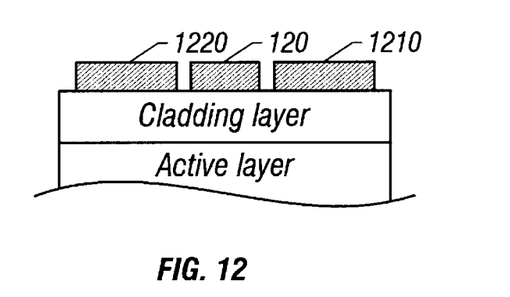
FIG. 12 is a diagram showing a configuration for edge-emitting devices and vertical cavity surface emitting lasers without a mesa structure.

In yet another variation, the mesa strip cladding layer in the edge-emitting devices or the mesa cladding layer in the VCSELs may be eliminated. The lasers based on such structure are gain-guided. FIG. 12 shows an example in which the driving current distribution provided by the ohmic contact 120 on the cladding layer defines the optical gain region and thus the optical modes. The control electrodes 1210 and 1220 create depletion regions to control the carrier distribution.

Furthermore, the VCSELs may also be configured so that a laser beam exits the optical cavity from the substrate side of the device.

These and other variations are intended to be encompassed by the invention as defined in the following claims.

What is claimed is:

1. A semiconductor device formed on a semiconductor substrate, comprising:

an active semiconductor medium layer responsive to a driving current across said active semiconductor medium layer to produce photons;

a first semiconductor cladding layer formed on a first side of said active semiconductor medium layer;

a second semiconductor cladding layer formed on a second opposing side of said active semiconductor medium layer, said first and second cladding layers operable to confine said photons within said active semiconductor medium layer;

first and second ohmic contacts respectively formed on said first side and second opposing side of said active semiconductor medium layer to supply said driving current;

an optical cavity formed to enclose at least a portion of said active semiconductor medium layer and having a cavity optic axis substantially perpendicular to said active semiconductor medium layer, said optical cavity controlling said photons to travel along said cavity optic axis; and a plurality of control electrodes separate from one another and disposed relative to said active semiconductor medium layer, at least one control electrode biased at a first control potential and one control electrode biased at a second control potential to control a spatial distribution of said driving current in said active semiconductor medium layer such that said driving current has an elongated cross section profile to make a polarization of said photons along the elongation direction.

2. A device as in claim 1, wherein at least a portion of at least one control electrode is directly in contact with a portion of said second cladding layer to form a reverse biased Schottky contact.

3. A device as in claim 2, wherein said second cladding layer is n-doped and said first and second control potentials are lower than a potential applied to said second ohmic contact.

4. A device as in claim 2, wherein said second cladding layer is p-doped and said first and second control potentials are higher than a potential applied to said second ohmic contact.

5. A device as in claim 1, further comprising an oxide layer on a portion of said second cladding layer and wherein at least a portion of at least one control electrode is directly in contact with said oxide layer to form a metal-oxide capacitor.

6. A device as in claim 5, wherein said second cladding layer is n-doped and said first and second control potentials are lower than a potential applied to said second ohmic contact.

7. A device as in claim 5, wherein said second cladding layer is p-doped and said first and second control potentials are higher than a potential applied to said second ohmic contact.

8. A device as in claim 1, wherein said active medium layer comprises one active semiconductor layer and two adjacent barrier layers which are respectively formed on each side of said active layer and have bandgaps at least equal to a bandgap of said active layer.

9. A device as in claim 8, wherein at least one of said barrier layers has a bandgap higher than said active layer.

10. A device as in claim 1, wherein said active medium layer comprises at least one quantum well.

11. A device as in claim 1, wherein at least one of said first and second control potentials on said control electrodes are modulated to produce a modulation in a number of said photons produced by said active semiconductor medium layer.

12. A device as in claim 1, wherein at least one control electrode is directly in contact with a portion of said active semiconductor medium layer to form a reverse biased Schottky contact.

13. A device as in claim 1, further comprising an oxide layer on a portion of said active semiconductor medium layer and wherein at least a portion of at least one control electrode is directly in contact with said oxide layer to form a metal-oxide capacitor.

14. A semiconductor device formed on a semiconductor substrate, comprising:

an active semiconductor medium layer responsive to a driving current to produce photons;

a first semiconductor cladding layer formed on a first side of said active semiconductor medium layer;

a second semiconductor cladding layer formed on a second opposing side of said active semiconductor medium layer, said first and second cladding layers operable to confine said photons within said active semiconductor medium layer;

first and second ohmic contacts respectively formed on said first side and second opposing side of said active semiconductor medium layer to supply said driving current;

first and second optical reflectors respectively formed on said first and second sides of said active semiconductor medium layer to form an optical cavity that encloses at least a portion of said active semiconductor medium layer and has a cavity optic axis substantially perpendicular to said active semiconductor medium layer; and a plurality of control electrodes disposed relative to said active semiconductor medium layer and electrically biased with respect to at least one of said first and second ohmic contacts, at least one control electrode biased at a first control potential and one control electrode biased at a second control potential to control a spatial distribution of said driving current in said active semiconductor medium layer to have an elongated cross sectional profile so as to control a polarization direction of said photons that is substantially perpendicular to said cavity optic axis.

15. A device as in claim 14, wherein at least a portion of one control electrode is directly in contact with a portion of said second cladding layer to form a reverse biased Schottky contact.

16. A device as in claim 15, wherein said second cladding layer is n-doped and said first and second control potentials are lower than a potential applied to said second ohmic contact.

17. A device as in claim 15, wherein said second cladding layer is p-doped and said first and second control potentials are higher than a potential applied to said second ohmic contact.

18. A device as in claim 14, further comprising an oxide layer on a portion of said second cladding layer and wherein at least a portion of one control electrode is directly in contact with said oxide layer to form a metal-oxide capacitor.

19. A device as in claim 18, wherein said second cladding layer is n-doped and said first and second control potentials are lower than a potential applied to said second ohmic contact.

20. A device as in claim 18, wherein said second cladding layer is p-doped and said first and second control potentials are higher than a potential applied to said second ohmic contact.

21. A device as in claim 14, wherein at least one control electrode is directly in contact with a portion of said active semiconductor medium layer to form a reverse biased Schottky contact.

22. A device as in claim 14, further comprising an oxide layer on a portion of said active semiconductor medium layer and wherein at least a portion of one control electrode is directly in contact with said oxide layer to form a metal-oxide capacitor.

23. A device as in claim 14, wherein at least one of said first and second optical reflectors comprises a plurality of alternating quarter-wavelength dielectric layers with different indices of refraction to form a distributed Bragg reflector.

24. A device as in claim 14, wherein said control electrodes are arranged relative to one another in a symmetric pattern with respect to said cavity optic axis.

25. A device as in claim 14, wherein said control electrodes are operable to adjust a size of said spatial distribution of said driving current to change an amount of said driving current at which a number of photons produced by said active semiconductor medium layer exceed a number of photons lost in a round trip in said optical cavity.

26. A device as in claim 14, wherein said first and second control potentials are modulated to produce a modulation in a number of said photons produced by said active semiconductor medium layer.

* * * * *